(12) United States Patent
Liao et al.

(10) Patent No.: US 7,719,624 B2
(45) Date of Patent: May 18, 2010

(54) ACTIVE DEVICE ARRAY SUBSTRATE

(75) Inventors: Chin-Yuen Liao, Taoyuan (TW);
Ko-Ching Yang, Taoyuan (TW)

(73) Assignee: Au Optronics Corporation, Hsinchu (TW)

( * ) Notice: Subject to any disclaimer, the term of this patent is extended or adjusted under 35 U.S.C. 154(b) by 142 days.

(21) Appl. No.: 11/553,479

(22) Filed: Oct. 27, 2006

(65) Prior Publication Data

US 2007/0272983 A1 Nov. 29, 2007

(30) Foreign Application Priority Data

May 26, 2006 (TW) .............................. 95118721 A

(51) Int. Cl.
*H01L 23/62* (2006.01)
(52) U.S. Cl. .............................. 349/40; 257/72; 257/355
(58) Field of Classification Search .................. 257/59, 257/72, 173, 335–367, 379, 528–543; 349/40
See application file for complete search history.

(56) References Cited

U.S. PATENT DOCUMENTS

| | | | | |
|---|---|---|---|---|
| 5,677,745 | A * | 10/1997 | Kawano et al. | 349/42 |
| 5,781,253 | A * | 7/1998 | Koike et al. | 349/40 |
| 5,929,829 | A * | 7/1999 | Pitt | 345/87 |
| 6,355,958 | B1 * | 3/2002 | Orchard-Webb | 257/355 |
| 6,380,591 | B1 * | 4/2002 | Kawano | 257/359 |
| 7,005,707 | B2 * | 2/2006 | Lai | 257/355 |
| 7,158,194 | B2 * | 1/2007 | Lo et al. | 349/40 |
| 7,304,351 | B2 * | 12/2007 | Liu et al. | 257/355 |
| 7,332,379 | B2 * | 2/2008 | Chen et al. | 438/130 |
| 7,361,964 | B2 * | 4/2008 | Huang et al. | 257/488 |
| 7,612,837 | B2 * | 11/2009 | Lo et al. | 349/40 |
| 2002/0044228 | A1 * | 4/2002 | Oh et al. | 349/40 |
| 2002/0101547 | A1 | 8/2002 | Lee et al. | |
| 2005/0023614 | A1 * | 2/2005 | Lai | 257/360 |
| 2005/0078232 | A1 * | 4/2005 | Lo et al. | 349/40 |
| 2006/0103772 | A1 * | 5/2006 | Lee | 349/40 |
| 2006/0203403 | A1 * | 9/2006 | Schediwy et al. | 361/56 |
| 2008/0180591 | A1 * | 7/2008 | Shie | 349/40 |

FOREIGN PATENT DOCUMENTS

| | | |
|---|---|---|
| CN | 1529197 A | 9/2004 |
| DE | 19707769 | 9/1998 |
| JP | 7-142824 | 6/1995 |
| JP | 2006032536 | 2/2006 |

OTHER PUBLICATIONS

"3rd Office Action of China Counterpart Application", issued on Jun. 5, 2009, pp. 1-9.

\* cited by examiner

*Primary Examiner*—Kiesha R Bryant
*Assistant Examiner*—Eric Ward
(74) *Attorney, Agent, or Firm*—Jianq Chyun IP Office

(57) ABSTRACT

An active device array substrate, including a substrate, a plurality of pixel units, a plurality of first lead wires, an insulating layer, a plurality of second lead wires and a passivation layer, is provided. The active device array substrate has a display area and a peripheral area. The pixel units are disposed in the display area of the substrate. The first lead wires and the second lead wires are disposed in the peripheral area, and electrically connected to the pixel units respectively. The first lead wires have two opposite first tips. Moreover, the first lead wires are covered by the insulating layer having at least a first opening to expose the two opposite first tips. Additionally, the second lead wires are covered by the passivation layer.

11 Claims, 3 Drawing Sheets

ACTIVE DEVICE ARRAY SUBSTRATE

CROSS-REFERENCE TO RELATED APPLICATION

This application claims the priority benefit of Taiwan application serial no. 95118721, filed on May 26, 2006. All disclosure of the Taiwan application is incorporated herein by reference.

BACKGROUND OF THE INVENTION

1. Field of Invention

The present invention relates to an active device array substrate, and more particularly to an active device array substrate with an electrostatic discharge protection.

2. Description of Related Art

Nowadays, with the rapid progress of the semiconductor device and the display device, the multimedia technology has become advanced. For the display, the liquid crystal display (LCD) with the advantages of high definition, high space utilization efficiency, low power consumption and no radiation has gradually become the mainstream of the market. Usually, during the process of manufacturing the LCD, the operators, the apparatuses or the inspecting equipments may have electrostatic charge. When each mentioned charged body (the operators, the apparatuses or the inspecting equipments) is contacted a liquid crystal display panel, the elements and circuits of the liquid crystal display panel may be damaged by the electrostatic discharge.

In order to protect the elements and circuits of a thin film transistor array substrate of the liquid crystal display panel from being damaged by the electrostatic discharge, an electrostatic discharge protecting structure is generally formed outside the display area of the thin film transistor array substrate. FIG. 1 is a schematic view of a conventional thin film transistor array substrate. Referring to FIG. 1, the conventional thin film transistor array substrate 100 has a display area A and a peripheral area B. Particularly, the display area A has a plurality of pixel units 112, a plurality of scan lines 120 and a plurality of data lines 130. The scan lines 120 and the data lines 130 are electrically connected to the pixel units 112, and the voltage signal is transmitted to the pixel units 112 through the scan lines 120 and the data lines 130. Moreover, the scan lines 120 and the data lines 130 extend to the peripheral area B to be electrically connected to a plurality of pads 140 respectively.

In practice, in order to protect the elements and circuits of the thin film transistor array substrate 100 from being damaged by the electrostatic discharge, an electrostatic discharge structure is generally formed on the scan line 120 and the data line 130 of the peripheral area B. Taking the scan line 120 as an example, referring to FIG. 2, it is a partially schematic cross-sectional view of a scan line in the conventional peripheral area. The conventional thin film transistor array substrate 100 comprises a substrate 110, a scan line 120 and an insulating layer 122. The scan line 120 has two opposite electrostatic discharge tips 120a. The two opposite electrostatic discharge tips 120a are separated from each other by a gap G, and the insulating layer 122 covers the electrostatic discharge tips 120a of the scan line 120, so as to serve as the electrostatic discharge structure.

The material of the insulating layer 122 is silicon nitride ($SiN_x$). The conductivity of silicon nitride ($SiN_x$) (the dielectric constant is about 7) is poor such that the electrostatic discharge protection effect cannot be achieved effectively. As the result, the electrostatic charges are accumulated on the scan line 120 and cannot be effectively eliminated, such that the pixel unit 112 of the display area A is damaged by the electrostatic discharge. In order to solve the problem caused by the poor conductivity of silicon nitride ($SiN_x$), one way is to replace the silicon nitride ($SiN_x$) by the amorphous silicon to cover the electrostatic discharge tips 120a. However, it is quite difficult to form the amorphous silicon in the peripheral area B to cover the electrostatic discharge tips 120a in the process, and the whole manufacturing cost of the thin film transistor array substrate 100 is increased accordingly.

SUMMARY OF THE INVENTION

One of the objectives of the present invention is to provide an active device array substrate, for solving the problem of the undesirable electrostatic discharge protection effect of the conventional thin film transistor array substrate.

One of the objectives of the present invention is to provide an active device array substrate, which has the design of electrostatic discharge protection with low manufacturing cost.

In order to achieve the above or other objectives, the present invention provides an active device array substrate, which has a display area and a peripheral area outside the display area. The active device array substrate comprises a substrate, a plurality of pixel units, a plurality of first lead wires, an insulating layer, a plurality of second lead wires and a passivation layer. The pixel units are disposed in the display area of the substrate, and the first lead wires are disposed in the peripheral area and electrically connected to the pixel units. Each of the first lead wires has two opposite first tips being separated from each other for a first interval. Moreover, the first lead wires are covered by the insulating layer having at least a first opening for exposing the two opposite first tips. Further, the second lead wires are disposed in the peripheral area, and electrically connected to the pixel units. The second lead wires are covered by the passivation layer, and the second lead wires are located between the insulating layer and the passivation layer.

According to an embodiment of the present invention, the covering scope of the first opening is larger than that of the first interval.

According to an embodiment of the present invention, the active device array substrate further comprises a first filler filled into the first opening, wherein the dielectric constant of the first filler is smaller than that of the insulating layer.

According to an embodiment of the present invention, each of the second lead wires has two opposite second tips being separated from each other for a second interval.

According to an embodiment of the present invention, the second lead wires are covered by the passivation layer having at least a second opening for exposing the two opposite second tips.

According to an embodiment of the present invention, the covering scope of the second opening is larger than that of the second interval.

According to an embodiment of the present invention, the active device array substrate further comprises a second filler filled into the second opening, and the dielectric constant of the second filler is smaller than that of the passivation layer.

According to an embodiment of the present invention, the material of the first filler comprises the organic insulating material or silicon oxide.

According to an embodiment of the present invention, the material of the second filler comprises the organic insulating material or silicon oxide.

The present invention provides an active device array substrate, which has a display area and a peripheral area outside the display area. The active device array substrate comprises a substrate, a plurality of pixel units, a plurality of first lead wires, an insulating layer, a plurality of second lead wires and a passivation layer. The pixel units are disposed in the display area of the substrate, and the first lead wires are disposed in the peripheral area and electrically connected to the pixel units. Moreover, the first lead wires are covered by the insulating layer. The second lead wires are disposed in the peripheral area, and electrically connected to the pixel units. Each of the second lines has two opposite electrostatic discharge tips being separated apart from each other for an interval. Further, the second lead wires are covered by the passivation layer, and the second lead wires are located between the insulating layer and the passivation layer. The passivation layer has at least one opening for exposing the two opposite electrostatic discharge tips.

According to an embodiment of the present invention, the covering scope of the opening is larger than that of the interval between the electrostatic discharge tips.

According to an embodiment of the present invention, the active device array substrate further comprises a filler filled into the opening, and the dielectric constant of the filler is smaller than that of the passivation layer.

According to an embodiment of the present invention, the material of the filler comprises the organic insulating material or silicon oxide.

According to an embodiment of the present invention, the pixel unit comprises a pixel unit of an LCD.

According to an embodiment of the present invention, the pixel unit comprises a pixel unit of an organic electro-luminescence display (OELD).

In the active device array substrate of the present invention, the insulating layer has a first opening, so as to expose the first tip. Since the dielectric constant of the air is relatively low, the electrostatic discharge effect may be achieved effectively in the first opening, thereby effectively protecting the elements on the active device array substrate from being damaged by the electrostatic discharge. In the active device array substrate of the present invention, the passivation layer has a second opening for exposing the second tip, thereby protecting the active device array substrate from being damaged by the electrostatic discharge as well. The active device array substrate of the present invention forms both the first opening in the insulating layer and the second opening in the passivation layer, so as to further protect the active device array substrate from being damaged by the electrostatic discharge.

In order to make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1:
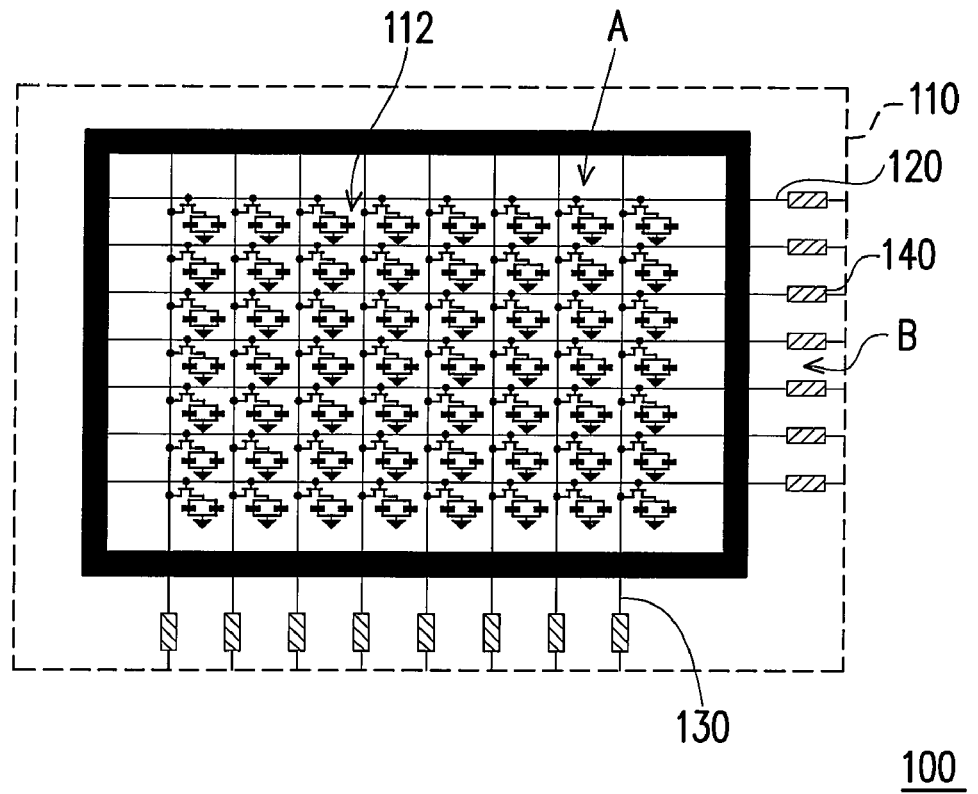
FIG. 1 is a schematic view of a conventional thin film transistor array substrate.
Figure 2:
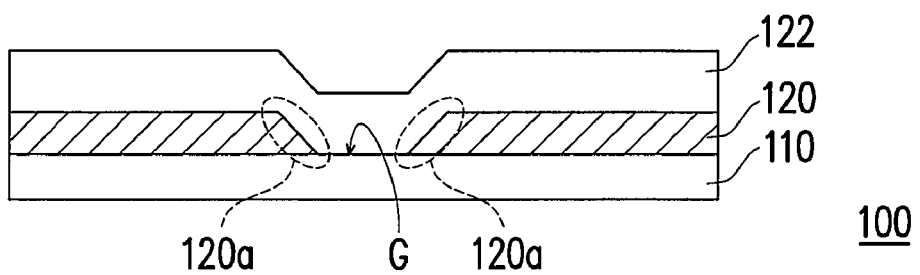
FIG. 2 is a partially schematic cross-sectional view of a scan line in a conventional peripheral area.
Figure 3:
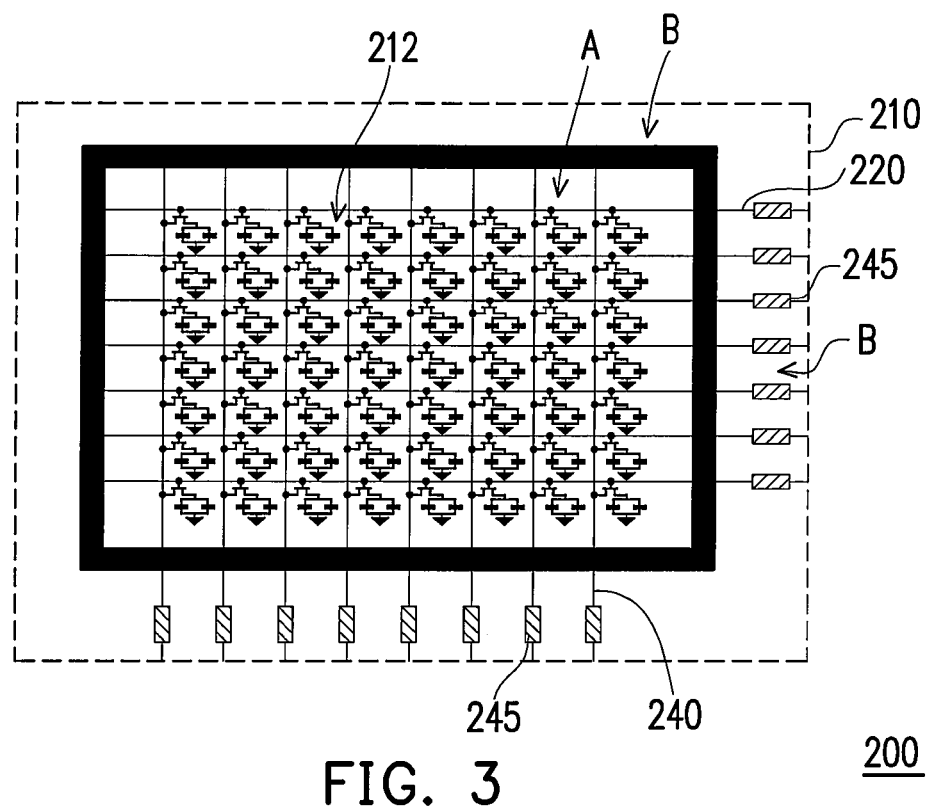
FIG. 3 is a schematic view of an active device array substrate according to a first embodiment of the present invention.
Figure 4:
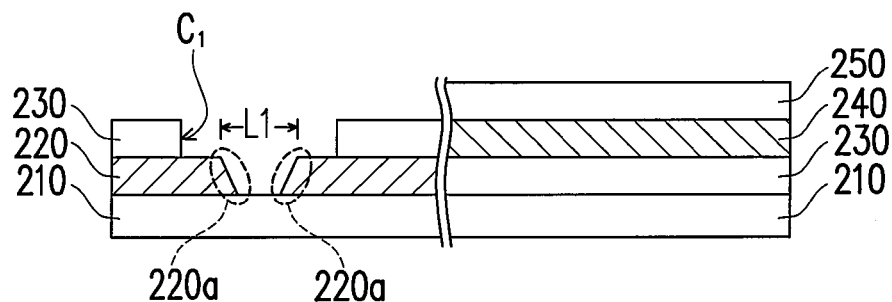
FIG. 4 is a partially schematic cross-sectional view of a peripheral area for the active device array substrate according to the first embodiment of the present invention.

FIG. 3 is a schematic view of an active device array substrate according to a first embodiment of the present invention, and FIG. 4 is a partially schematic cross-sectional view of a peripheral area for the active device array substrate according to the first embodiment of the present invention. Referring to FIGS. 3 and 4, the active device array substrate 200 of the present invention has a display area A and a peripheral area B outside the display area A. The active device array substrate 200 comprises a substrate 210, a plurality of pixel units 212, a plurality of first lead wires 220, an insulating layer 230, a plurality of second lead wires 240, a plurality of pads 245 and a passivation layer 250. The pixel units 212 are arranged into an array in the display area A of the substrate 210, and the first lead wires 220 and the second lines 240 are disposed in the peripheral area B and electrically connected to the pads 245. The first lead wires 220 and the second lead wires 240 are electrically connected to the pixel units 212 in the display area A respectively. Moreover, the first lead wires 220 are covered by the insulating layer 230, and the second lead wires 240 are located between the insulating layer 230 and the passivation layer 250.

Particularly, the first lead wires 220 may be the scan lines, and the second lead wires 240 may be the data lines. In practice, the voltage signal is transmitted into the pixel units 212 through the first lead wires 220 and the second lead wires 240. It should be noted that, the pixel unit 212 is illustrated by taking the pixel unit 212 of the liquid crystal display panel as an example. Of course, the pixel unit 212 may also be the pixel unit 212 of the organic electro-luminescence display (OELD), which thus is not limited herein.

As known from FIG. 4 that, the first lead wire 220 in the peripheral area B of the substrate 210 has two opposite first tips 220a, and the first tips 220a are separated apart from each other for a first interval L1. It should be noted that, the first tips 220 of the present invention has the electrostatic discharge function. In practice, the pads 245 are electrically connected to the shorting ring (not shown), and the first tips 220 may be located between the shorting ring and the pads 245, or between the pads 245 and the display area A. Of course, the position of the first tips 220a may be adjusted appropriately depending on the requirements, which thus is not limited herein.

It should be noted that, the first lead wires 220 are covered by the insulating layer 230. The insulating layer 230 has at least a first opening C1 being larger than the first interval L1, so as to expose the two opposite first tips 220a. In practice, the first opening C1 may be formed by etching the insulating layer 230.

It should be mentioned that, the two opposite first tip 220a may form a capacitor, according to:

$$V=Q/C$$

V: voltage difference
Q: charge quantity
C: capacitance value, if the charge quantity Q is the same, the smaller the capacitance value C is, the bigger the voltage difference V for the two opposite first tips 220a is. The capacitance value C is in direct proportion to the dielectric constant of the dielectric material in the capacitor. The two opposite first tips 220 are exposed to the air through the first opening C1, and the dielectric constant of the conventional insulating layer silicon nitride (SiNx) 130 is about seven times of the dielectric constant of the air. Therefore, the voltage difference V between the two opposite first tips 220a of the present invention is relatively large, such that the electrostatic charges are accumulated at the first tips 220a, and thereby being effectively discharged. Therefore, the elements on the active device array substrate 200 are protected from being damaged by the electrostatic discharge (ESD).

Figure 5:
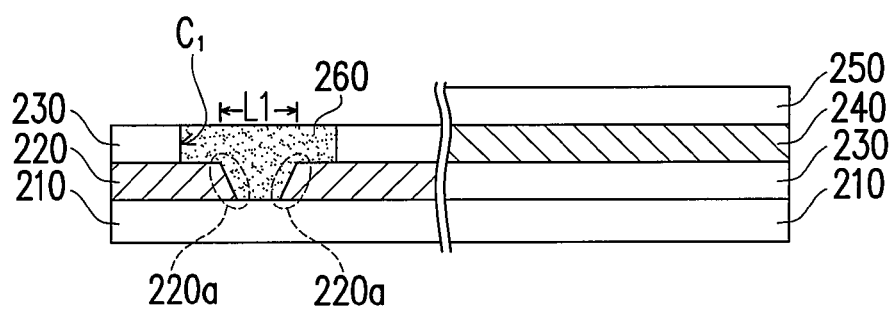
FIG. 5 is a cross-sectional view of a first filler according to the first embodiment of the present invention.

Moreover, the active device array substrate 200 of the present invention further comprises a first filler 260 (as shown in FIG. 5). The first filler 260 may be selectively filled into the first opening C1, and the material of the first filler 260 may be an organic insulating material, benzocyclobutene (BCB) or silicon oxide ($SiO_2$), as long as the dielectric constant of the first filler 260 is smaller than that of the insulating layer 230, which is not limited herein.

Figure 6:
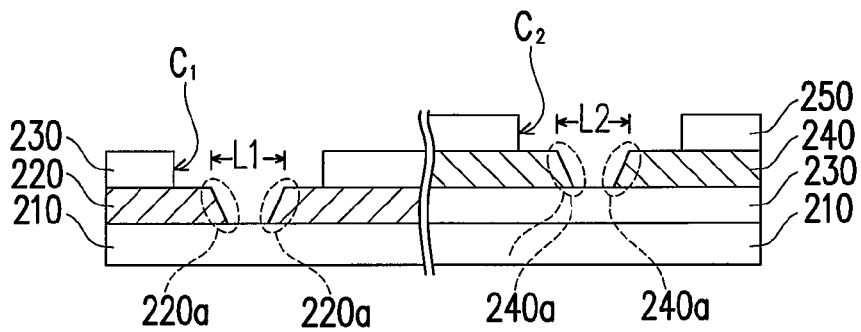
FIG. 6 is a partially schematic cross-sectional view of the peripheral area for another active device array substrate according to the first embodiment of the present invention.

In order to further protect the active device array substrate 200 of the present invention from being damaged by the electrostatic discharge, the second lead wire 240 has two opposite second tips 240a (as shown in FIG. 6), and the two opposite second tips 240a are separated apart from each other for a second interval L2. Moreover, the second lead wires 240 are covered by the passivation layer 250 having at least a second opening C2 with the covering scope being larger than that of the second interval L2, so as to expose the two opposite second tips 240a. As a result, the electrostatic charges are also accumulated at the first tips 220a, and thereby being effectively discharged, so as to protect the active device array substrate 200 from being damaged by the electrostatic discharge.

Figure 7:
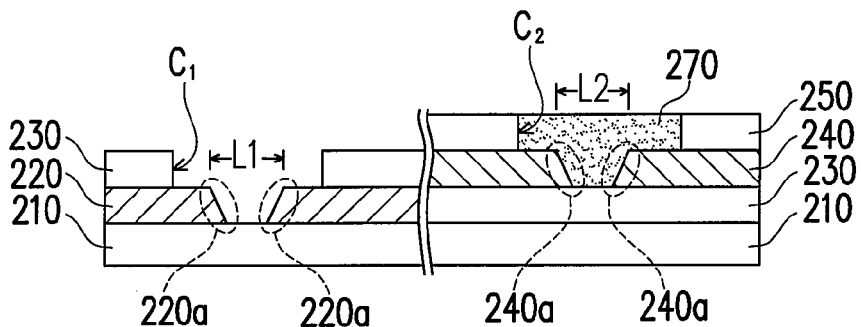
FIG. 7 is a cross-sectional view of a second filler according to the first embodiment of the present invention.

Moreover, the active device array substrate 200 of the present invention further comprises a second filler 270 (as shown in FIG. 7). The second filler 270 may be selectively filled into the second opening C2, and the material of the second filler 270 may be an organic insulating material, benzocyclobutene (BCB) or silicon oxide ($SiO_2$), as long as the dielectric constant of the second filler 270 is smaller than that of the passivation layer 250, which is not limited herein.

Second Embodiment

Figure 8:
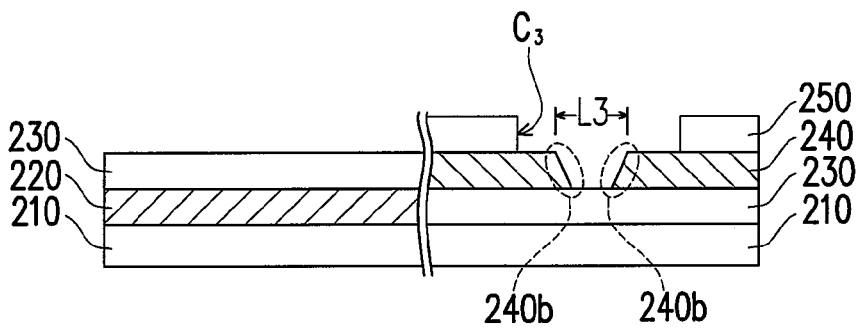
FIG. 8 is a partially schematic cross-sectional view of a peripheral area of an active device array substrate according to a second embodiment of the present invention.

FIG. 8 is a partially schematic cross-sectional view of a peripheral area of an active device array substrate according to a second embodiment of the present invention. Referring to FIG. 8, the second embodiment is similar to the first embodiment, the main difference therein is that: the active device array substrate 200 of the present invention only forms two opposite electrostatic discharge tips 240b on the second lead wires 240, and the passivation layer 250 has at least one opening C3 for exposing the two opposite electrostatic discharge tips 240b. Particularly, the two opposite electrostatic discharge tips 240b are separated apart from each other for an interval L3, and the covering scope of the opening C3 is larger than the interval L3 between the electrostatic discharge tips 240b.

Figure 9:
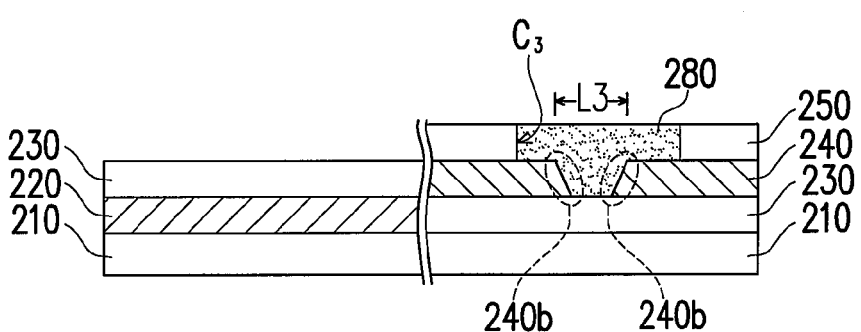
FIG. 9 is a cross-sectional view of the filler according to the second embodiment of the present invention.

The active device array substrate 200 of the present invention further comprises a filler 280 (as shown in FIG. 9). The filler 280 may be selectively filled into the opening C3, and the material of the filler 280 may be an organic insulating material, benzocyclobutene (BCB) or silicon oxide ($SiO_2$), as long as the dielectric constant of the filler 280 is smaller than that of the passivation layer 250, which is not limited herein.

In summary, in the active device array substrate of the present invention, the insulating layer has the first opening for exposing the two opposite first tips. Because the dielectric constant of the air is relatively low, when the charge quantity is the same, the voltage difference for the two opposite first tips is relatively high. In this manner, the electrostatic charges accumulated at the first tip are effectively discharged at the first opening, so as to effectively protect the active device array substrate from being damaged by the electrostatic discharge. The active device array substrate of the present invention may only form the opening in the passivation layer for exposing the electrostatic discharge tips, and may also form both the first opening in the insulation layer and the second opening in the passivation layer, so as to further protect the active device array substrate from being damaged by the electrostatic discharge.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, having a display area and a peripheral area outside the display area, comprising:
   a substrate;
   a plurality of pixel units, disposed in the display area;
   a plurality of first lead wires, disposed in the peripheral area of the substrate, and electrically connected to the pixel units, wherein each of the first lead wires has two opposite first tips being separated apart from each other for a first interval;
   an insulating layer, covering the first lead wires, and having at least a first opening for exposing top surfaces of the two opposite first tips, wherein a covering scope of the first opening is greater than that of the first interval;
   a first filler, filling the first opening and covering the top surfaces and sidewalls of the two opposite first tips exposed by the insulating layer, the dielectric constant of the first filler being smaller than that of the insulating layer, wherein the material of the first filler comprises an organic insulating material, benzocyclobutene, or silicon oxide;
   a plurality of second lead wires, disposed in the peripheral area and electrically connected to the pixel units; and
   a passivation layer, covering the second lead wires, wherein the second lead wires are located between the insulating layer and the passivation layer.

2. The active device array substrate of claim 1, wherein each of the second lead wires has two opposite second tips being separated apart from each other for a second interval.

3. The active device array substrate of claim 2, wherein the second lead wires are covered by the passivation layer having at least a second opening for exposing the two opposite second tips.

4. The active device array substrate of claim 3, wherein the covering scope of the second opening is greater than that of the second interval.

5. The active device array substrate of claim 2, further comprising a second filler filling the second opening, wherein the dielectric constant of the second filler is smaller than that of the passivation layer.

6. The active device array substrate of claim 5, wherein the material of the second filler comprises an organic insulating material, benzocyclobutene, or silicon oxide.

7. The active device array substrate of claim 1, wherein the pixel unit comprises a pixel unit of a liquid crystal display (LCD).

8. The active device array substrate of claim 1, wherein the pixel unit comprises a pixel unit of an organic electro-luminescence display (OELD).

9. An active device array substrate, having a display area and a peripheral area outside the display area, comprising:
   a substrate;
   a plurality of pixel units, disposed in the display area;
   a plurality of first lead wires, disposed in the peripheral area of the substrate, and electrically connected to the pixel units;
   an insulating layer, covering the first lead wires;
   a plurality of second lead wires, disposed in the peripheral area, and electrically connected to the pixel units, wherein each of the second lead wires has two opposite electrostatic discharge tips being separated apart from each other for an interval;
   a passivation layer, covering the second lead wires, wherein the second lead wires are located between the insulating layer and the passivation layer, and the passivation layer has at least one opening for exposing top surfaces of the two opposite electrostatic discharge tips, wherein a covering scope of the opening is greater than that of the interval; and
   a filler, filling the opening and covering the top surfaces and sidewalls of the two opposite electrostatic discharge tips exposed by the passivation layer, the dielectric constant of the filler being smaller than that of the passivation layer, wherein the material of the filler comprises an organic insulating material, benzocyclobutene, or silicon oxide.

10. The active device array substrate of claim 9, wherein the pixel unit comprises a pixel unit of a liquid crystal display (LCD).

11. The active device array substrate of claim 9, wherein the pixel unit comprises a pixel unit of an organic electro-luminescence display (OELD).

* * * * *